(12) United States Patent
Kawashima

(10) Patent No.: US 7,479,836 B2
(45) Date of Patent: Jan. 20, 2009

(54) OSCILLATION CIRCUIT AND SEMICONDUCTOR DEVICE COMPRISING THAT OSCILLATION CIRCUIT

(75) Inventor: Hidekazu Kawashima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 62 days.

(21) Appl. No.: 11/414,255

(22) Filed: May 1, 2006

(65) Prior Publication Data
US 2006/0255869 A1 Nov. 16, 2006

(30) Foreign Application Priority Data
May 12, 2005 (JP) ............................. 2005-139835

(51) Int. Cl.
 H03B 1/00 (2006.01)
 H03B 5/32 (2006.01)
(52) U.S. Cl. ..................... 331/74; 331/116 R; 331/158
(58) Field of Classification Search ................. 331/74, 331/108 R, 116 R, 116 FE, 116 M, 108 A, 331/108 C, 154, 158, 160
See application file for complete search history.

(56) References Cited

U.S. PATENT DOCUMENTS 3,584,241 A * 6/1971 Nakamura ................. 327/205
5,030,926 A * 7/1991 Walden ................. 331/116 FE
5,266,908 A * 11/1993 Koulopoulos et al. .......... 331/2
6,118,348 A * 9/2000 Narahara ............... 331/116 FE
6,703,905 B2 * 3/2004 Sekimoto ............... 331/116 FE
2003/0184392 A1* 10/2003 Matsushita ................... 331/74
2005/0017812 A1* 1/2005 Ashida et al. ............... 331/158

FOREIGN PATENT DOCUMENTS

JP 5-343919 12/1993
JP 2000-332536 11/2000

* cited by examiner

Primary Examiner—Robert Pascal
Assistant Examiner—Ryan J. Johnson
(74) Attorney, Agent, or Firm—McGinn IP Law Group, PLLC

(57) ABSTRACT

An oscillation circuit used in a semiconductor device such as a cell-based IC, and comprises: an inverting amplifier, which is constructed so that it is possible connect a crystal oscillator XL between its input and output terminals, and so that it is possible to adjust its gain by a control signal CNT; and a wave-shaping circuit such as a Schmitt circuit that shapes the waveform of the oscillation signal output from the inverting amplifier. The wave-shaping circuit is constructed so that it is possible to adjust the gain when shaping a waveform according to a control signal CNT to correspond with the gain adjustment of the inverting amplifier.

18 Claims, 6 Drawing Sheets

OSCILLATION CIRCUIT AND SEMICONDUCTOR DEVICE COMPRISING THAT OSCILLATION CIRCUIT

FIELD OF THE INVENTION

This invention relates to an oscillation circuit and a semiconductor device that comprises the oscillation circuit, and more particularly to an oscillation circuit that uses a solid oscillator such as a crystal oscillator, and a semiconductor device that comprises the oscillator circuit.

BACKGROUND OF THE INVENTION

Oscillation circuits that use solid oscillators such as crystal oscillators are widely used in electronic equipment, and are used as a generating source for the reference-clock signal of the semiconductor device. Of this kind of oscillation circuit, circuits as shown in FIG. 6 having a construction in which a crystal oscillator XL and resistor R101 are connected in parallel between the input and output of an inverter circuit in which an N-type MOS transistor MN101 and P-type MOS transistor MP101 are connected in series, a capacitor C101 is connected to the input terminal, and a capacitor C102 is connected to the output terminal, are widely used. Also, several circuits are known in which depending on the purpose various changes are made to this basic circuit.

For example, in patent document 1, a semiconductor device is disclosed in which the required layout surface area of the oscillation circuit built in a microcomputer is reduced, and the operation thereof is stabilized. It is constructed so that a protection resistance located between the output terminal of a first CMOS logic circuit and a corresponding external terminal is done away with, and the drive performance of the first CMOS logic circuit is reduced. Also, together with being able to shorten the wiring between the output terminal of the first CMOS logic circuit and the corresponding external terminal, reduce the wiring resistance of that wiring, and further reduce the drive performance of the first CMOS logic circuit, it is possible to shorten the overall wiring length of the oscillation circuit as well as suppress the coupling noise between the wiring and the noise of the power supply. As a result, it is possible to reduce the required layout surface area and stabilize the operation thereof.

Also, in patent document 2, an oscillation circuit is disclosed in which power consumption and noise are reduced by optimizing the drive performance of the inverting amplifier when a crystal oscillator is connected. This oscillation circuit includes a drive-performance-selection circuit that detects an optimum drive-performance level of the inverting amplifier according to the element characteristics of the crystal oscillator, and sets the drive performance of the inverting amplifier based on the detection result. In other words, the circuit comprises a downcounter or upcounter that sets the drive-performance level of the inverting amplifier when a crystal oscillator is connected; it counts down or counts up to find the starting oscillation level, and sets the drive performance.

[Patent Document 1]
Japanese Patent Kokai Publication No. JP-A-5-343919
[Patent Document 2]
Japanese Patent Kokai Publication No. JP-P2000-332536A

SUMMARY OF THE DISCLOSURE

The disclosure of these patent documents are incorporated herein by reference thereto.

When the oscillation frequency is different for each product such as in a cell-based IC, it is necessary to prepare the oscillation circuit to be used for each oscillation frequency range. That is because when using a crystal oscillator, there is a possibility that when just the gain of the inverter circuit is large, the crystal oscillator will oscillate at a higher harmonic frequency that is 3 times or 5 times the basic oscillation frequency of the crystal oscillator. On the other hand, when the gain of the inverter circuit is small, there also exists the possibility that the oscillation circuit will not operate. Therefore, it is necessary to construct the oscillation circuit using an inverter circuit having suitable gain for the oscillation frequency.

Generally the output signal that is output from the oscillation circuit has a waveform that is close to a sine wave. In a sine wave shaped signal the gradient of the waveform is gradual (small), so when it is input to another input circuit as is, it could become the cause of malfunction due to noise when it is near the input threshold value of the input circuit, and there is a possibility that a duty ratio near 50% may not be obtainable. Therefore, a wave-shaping circuit is placed in a later stage of the oscillation circuit and the signal is formed into a digitized signal that is close to a square wave before being input into another input circuit. It is preferable that the signal obtained by wave shaping in this case have a trapezoidal waveform that has a suitable slope having a gradient corresponding to the oscillating frequency. That is because a signal having a waveform with a slope that is steeper than necessary includes many high-frequency signal components that would affect other circuits as noise, and the power consumption of the input circuit will become large, which is not preferable as a system.

However, patent document 1 only discloses a method of reducing the required layout surface area of the oscillation circuit, and does not touch upon the aforementioned problems. Also, patent document 2 only places emphasis on setting the drive-performance level of the inverting amplifier to which a crystal oscillator is connected, and does not comprise a method for obtaining a suitable oscillation signal for a wide range of oscillation frequencies. Furthermore, nothing is disclosed in regards to wave shaping of the output signal of the oscillation circuit. Therefore, in the prior art it was difficult to obtain an oscillation signal that had little effect, for example in the way of noise, on other circuits, and that was stable over a wide range of frequencies.

According to of one aspect of the invention there is provided an oscillation circuit comprising: an inverting amplifier that is constructed so that a solid oscillator can be connected between the input and output terminals thereof, and so that its gain can be adjusted externally; and a wave-shaping circuit that shapes the waveform of an oscillation signal that is output from the inverting amplifier to a digitized signal; and where the wave-shaping circuit is constructed so that it is capable of adjusting the wave-shaping characteristics to correspond with the gain adjustment by the inverting amplifier.

In a second aspect, the inverting amplifier comprises a plurality of inverter circuits that can be selectively operated; and one or two or more inverter circuits are selected from the group consisting of the plurality of inverter circuits to function as the inverting amplifier.

In a third aspect, the inverting amplifier may comprise a plurality of inverter circuits that can be selectively operated; and the plurality of inverter circuits each have different gains.

In a fourth aspect, the plurality of inverter circuits are constructed so that the sizes of the respective transistors that perform the inverting operation are different.

In a fifth aspect, the wave-shaping circuit comprises a plurality of Schmitt circuits that can be selectively operated; and the plurality of Schmitt circuits have respectively different rising and falling characteristics.

In a sixth aspect, the plurality of Schmitt circuits comprise inverter-type circuits, and are constructed so that the sizes of the respective transistors that perform the inverting operation are different from one another.

In a seventh aspect, there is provided a semiconductor device comprising the oscillator circuit of any one of the preceding aspects.

The meritorious effects of the present invention are summarized as follows.

With this invention, oscillation is generated by an inverting amplifier that has a gain corresponding to the oscillation frequency, and the waveform of the oscillation signal is shaped to correspond with the oscillation frequency, so it is possible to obtain a steady oscillation signal over a wide range of frequencies even when the oscillation frequency differs for each product such as a cell-based IC.

PREFERRED EMBODIMENTS OF THE INVENTION

The oscillation circuit of a first embodiment of the invention is used in a semiconductor device such as a cell-based IC. This oscillation circuit comprises an inverting amplifier (10 in FIG. 1) that is constructed so that a solid oscillator such as a crystal oscillator (XL in FIG. 1) can be connected between the input and output terminal, and so that the gain can be controlled externally by a control signal (CNT in FIG. 1). Also, the oscillation circuit comprises a wave-shaping circuit (11 in FIG. 1) that is constructed with a Schmitt circuit or the like that shapes the waveform of the oscillation circuit that is output from the inverting amplifier. The inverting amplifier includes a plurality of inverter circuits (13a to 13m in FIG. 3) that can be selectively operated and that function as an inverting amplifier by selecting one or two or more inverter circuits from the plurality of inverter circuits. The gain of the inverting amplifier is adjusted by externally selecting inverter circuits. Also, the Schmitt circuit is constructed so that the gain when shaping the waveform can be adjusted by a control signal (CNT in FIG. 1) that corresponds with the gain adjustment of the inverting amplifier.

Conventionally, when the oscillation frequency was different for each product, such as in a cell-based IC, it was necessary to design a plurality of types of oscillation-circuit blocks for a predetermined frequency range as a library for chip design. However, in the oscillation circuit constructed as described above, the design of the oscillation circuit is accomplished with just one design, and together with applying suitable gain to the inverting amplifier according to the oscillation frequency, a Schmitt circuit performs suitable wave shaping according to the oscillation frequency, making it possible to supply a steady oscillation signal that has little effect of noise or the like on other circuits. The preferred embodiments of the invention will be explained in detail below based on the drawings.

EMBODIMENT 1

Figure 1:
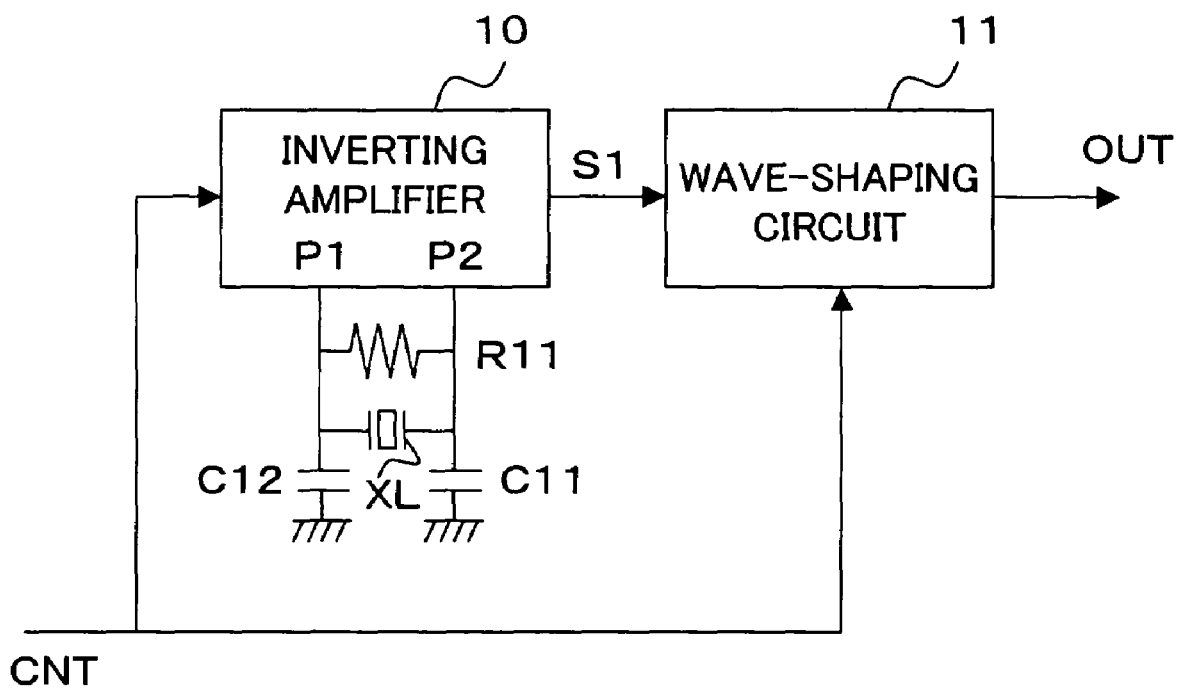
FIG. 1 is a block diagram showing the construction of the oscillation circuit of an embodiment of the invention.

FIG. 1 is a block diagram showing the construction of the oscillation circuit of an embodiment of the invention. In FIG. 1, the oscillation circuit comprises an inverting amplifier 10 and wave-shaping circuit 11. The inverting amplifier 10 includes an inverter circuit that is selected by a control signal CNT as will be described later, where a bias-giving resistor R11 and crystal oscillator XL are connected between the input terminal P1 and output terminal P2 of the inverting amplifier 10. Also, capacitors C12 and C11, which are grounded on one end, are connected between the input terminal P1 and output terminal P2. In the case where the oscillation circuit having this kind of construction is assembled as a cell-based IC, the crystal oscillator XL must steadily oscillate in a wide oscillation frequency range such as 1 to 60 Mhz. Therefore, one or two or more inverter circuits are selected from 4 to 8 inverter circuits by a control signal CNT in order to function as the inverting amplifier 10.

A sine-wave shaped signal S1 that is output from the inverting amplifier 10 is input to the wave-shaping circuit 11, and the wave-shaping circuit 11 shapes that signal into a square-shaped digitized signal and outputs it as an output signal OUT. When doing this, the wave-shaping circuit 11, according to a control signal CNT, shapes the output signal OUT into a trapezoidal-shaped waveform having a suitable slope (flank gradient). In this case, a Schmitt circuit is selected according to the control signal CNT from 4 to 8 Schmitt circuits having different rising or falling characteristics to function as a wave-shaping circuit.

Figure 2A:
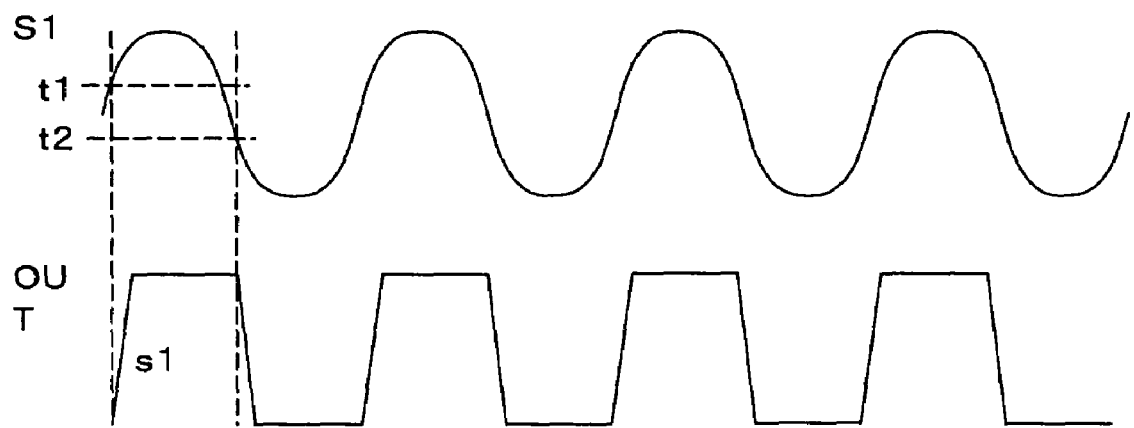
FIGS. 2A and 2B are drawings showing the waveform of the oscillation signal S1 and output signal OUT.
Figure 2B:
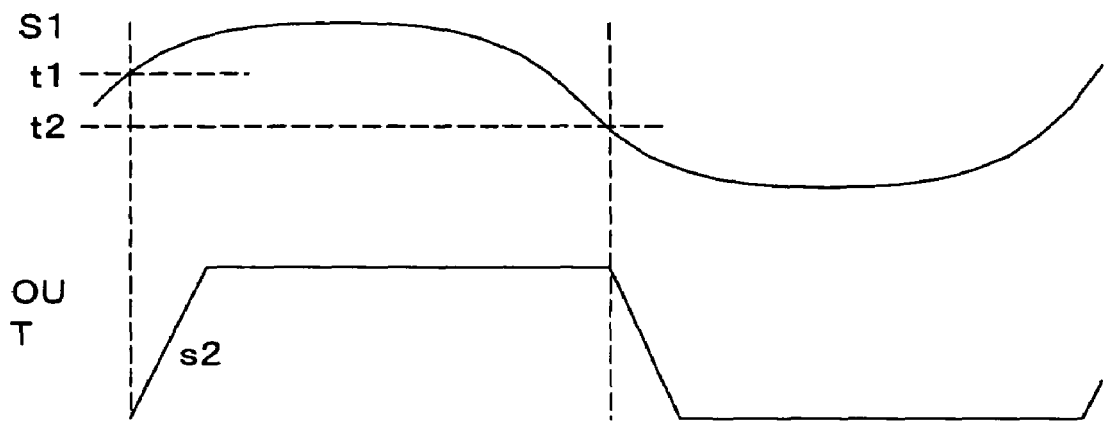

FIGS. 2A and 2B are drawings showing the waveform of the oscillation signal S1 and the output signal OUT. The oscillation signal S1 is shaped by the rising threshold level t1 and falling threshold level t2 into an output signal OUT having hysteresis characteristics. When doing this, when the frequency of the oscillation signal S1 is high as shown in FIG. 2A, the rising and falling characteristics are adjusted by the control signal CNT so that the slope of the shaped output signal OUT becomes gradual (small in the gradient).

Figure 3:
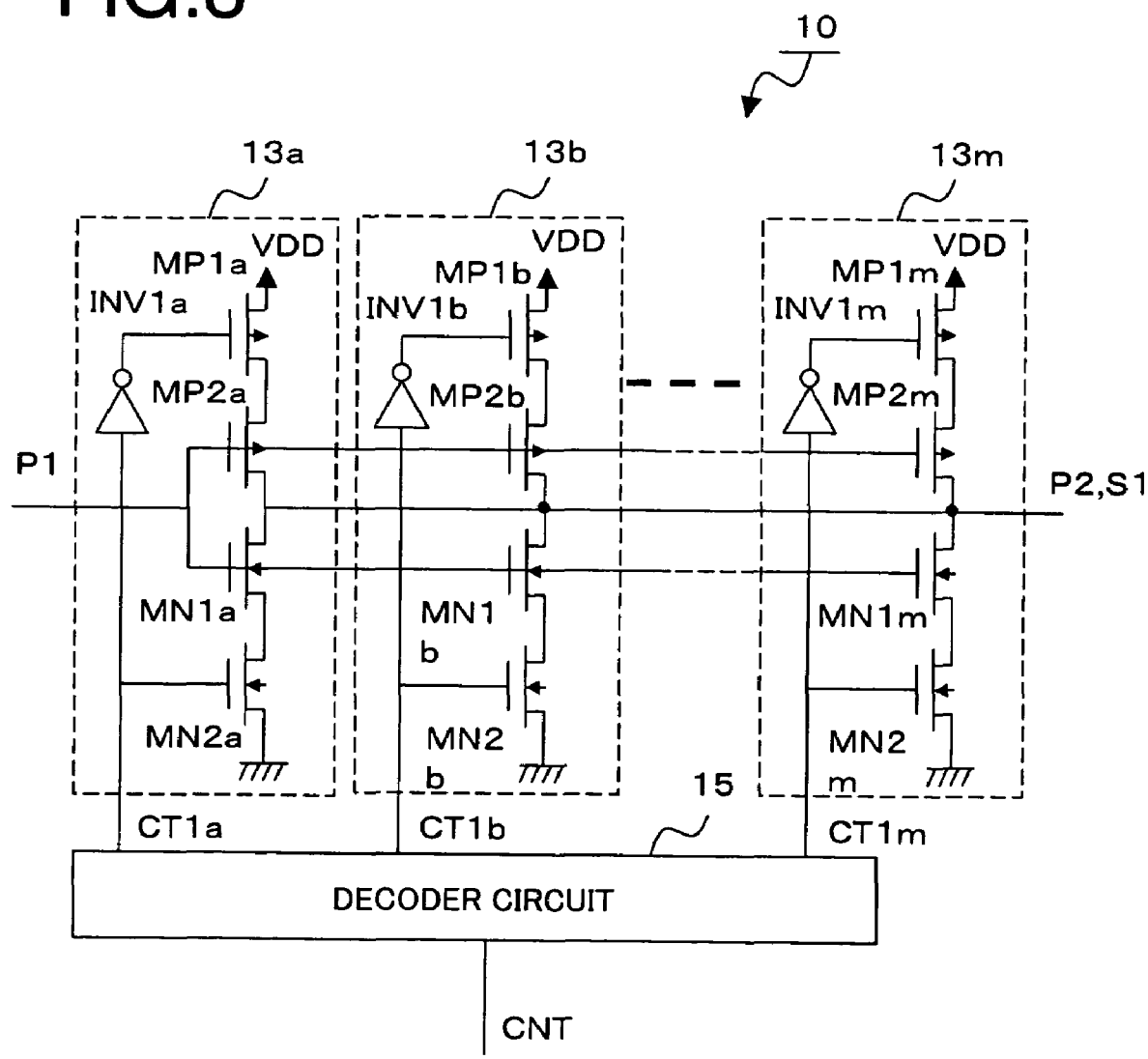
FIG. 3 is a circuit diagram of an inverting amplifier.

Next, the circuit construction of the inverting amplifier 10 will be explained in detail. FIG. 3 is a circuit diagram of the inverting amplifier 10. The inverting amplifier comprises a plurality of inverter circuits 13a to 13m, and a decoder circuit 15. Also, a decoder circuit 13k (k=a to m) comprises PMOS transistors MP1k, MP2k, NMOS transistors MN1k, MN2k, and an inverter INV1k. The source of the PMOS transistor MP1k is connected to the power source VDD, the drain is connected to the source of the PMOS transistor MP2k, and the gate is connected to the output of the inverter INV1. The drains of the PMOS transistor MP2k and NMOS transistor MN1k are common and are connected to the output terminal P2 (S1) of the inverting amplifier 10. The gates of the PMOS transistor MP2k and NMOS transistor MN1k are common and are connected to the input terminal P1 of the inverting amplifier 10. The source of the NMOS transistor MN2k is grounded, the drain is connected to the source of the NMOS transistor MN1k, and the gate is connected to the output CT1 of the decoder circuit 15 and the input of the inverter INV1k.

In the inverter circuit 13 constructed as described above, when the level of the output CT1k is high level, the PMOS transistor MP1k and NMOS transistor MN2k are ON. Therefore, the inverter comprising the PMOS transistor MP2k and NMOS transistor MN1k functions, and operates so that the signal input to the input terminal P1 is inverted, and amplified to output to the output terminal P2.

A decoder circuit 15 decodes the control signal CNT, which causes the inverter circuit corresponding to the decoding result to function as the inverting amplifier. In other words, it is possible for the control signal to cause desired one of the inverter circuits to operate as an inverting amplifier according to the oscillation frequency and to provide a suitable gain. When doing this, it is also possible to make the sizes of the PMOS transistors MP2k and NMOS transistors MN1k included in each respective inverter circuit 13k different, and to make the respective gains different; and it is also possible to change the gain so that a plurality of inverter circuits 13k are turned ON at the same time.

In the inverting amplifier 10 that is constructed as described above, by changing the gain of the inverting amplifier 10 by the control signal CNT to correspond with the oscillation frequency, it is possible to output a steady oscillation signal over a wide range of oscillation frequencies.

Figure 4:
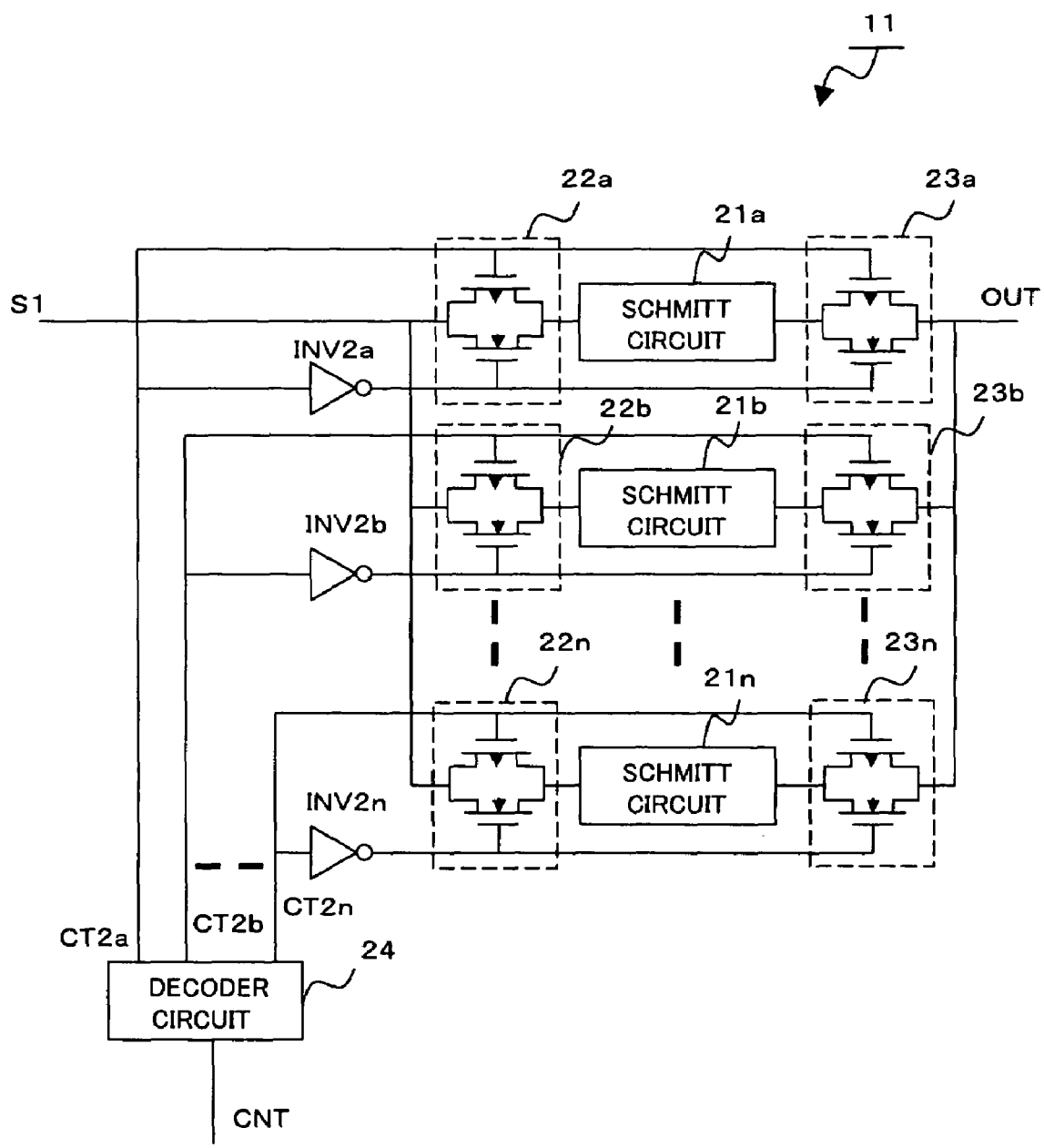
FIG. 4 is a circuit diagram of a wave-shaping circuit.

Next, the wave-shaping circuit 11 will be explained. FIG. 4 is a circuit diagram of the wave-shaping circuit 11. The wave-shaping circuit 11 comprises a plurality of Schmitt circuits 21a to 21n and a decoder circuit 24. There are also transfer gates 22k, 23k on the input and output sides of the Schmitt circuit 21k (k=a to n), and the decoded output CT2k from the decoder circuit 24, and the inverted output from the inverter INV2k are provided to the transfer gates 22k, 23k.

In the wave-shaping circuit 11 that is constructed as described above, when the level of the output CT2k from the decoder circuit 24 is high level, the transfer gates 22k, 23k are ON. Therefore, the oscillation signal from the output terminal S1 of the inverting amplifier 10 is input to the Schmitt circuit 21k, and an output signal OUT is output as a digitized signal having hysteresis.

The decoder circuit 24 decodes the control signal CNT, and the Schmitt circuits function according to the decoded result. In other words, a specified Schmitt circuit is selected and caused to operate by the control signal CNT so that suitable rising and falling characteristics are given according to the oscillation frequency.

The wave-shaping circuit 11 that is constructed as described above changes the rising and falling characteristics of the digitized signal according to the control signal CNT to correspond to the oscillation frequency, so that gradual rising and falling characteristics (small gradient) are given to signals that have a low oscillation frequency, and steep rising and falling characteristics (large gradient) are given to signals that have a high oscillation frequency. By doing this, it is possible to generate a signal that does not have an unnecessarily steep slope and that will not affect other circuits as noise. Also, it is possible to prevent an increase in power consumption of the circuit.

Figure 5:
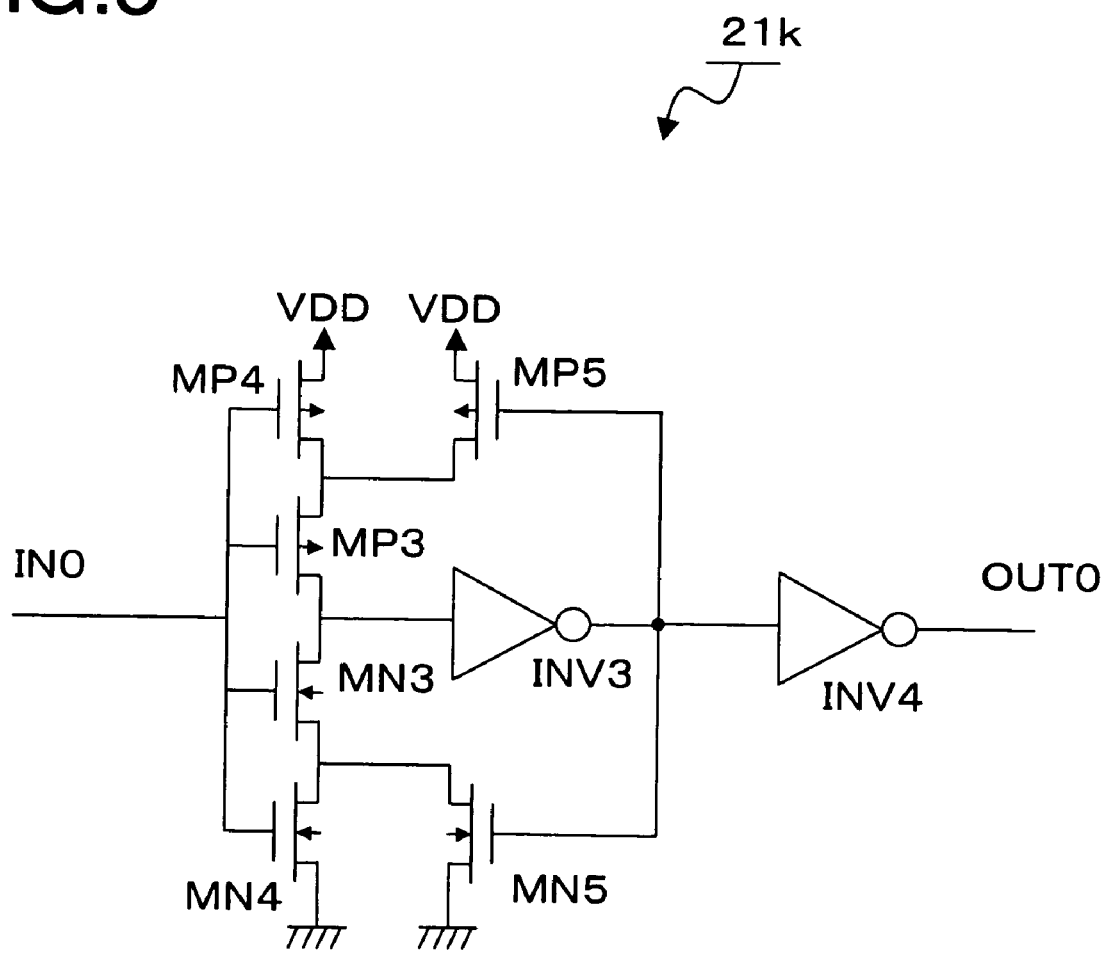
FIG. 5 is a circuit diagram of a inverter-type Schmitt circuit.
Figure 6:
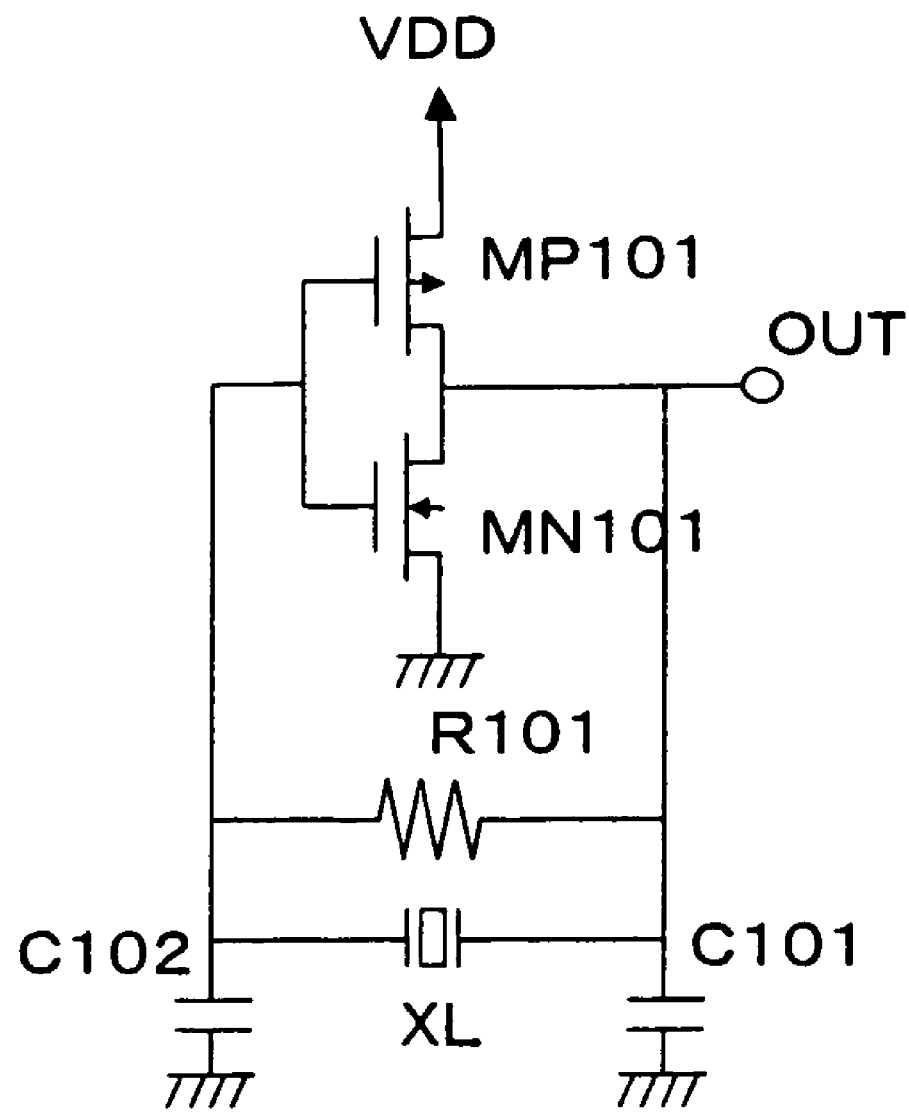
FIG. 6 is a circuit diagram of an oscillation circuit that uses a solid oscillator such as a typical crystal oscillator.

Next, the Schmitt circuit will be explained. FIG. 5 is a circuit diagram of an inverter-type Schmitt circuit 21k. The Schmitt circuit 21k makes possible hysteresis characteristics by changing the input threshold level according to the H/L level of the output of the first inverter. The construction and operation of the Schmitt circuit will be explained below.

The first stage inverter of the Schmitt circuit 21k is mainly constructed from a PMOS transistor MP3 and NMOS transistor MN3. The source of the PMOS transistor MP4 is connected to VDD, and the drain is connected to the source of the PMOS transistor MP3. Also, the source and drain of the PMOS transistor MP5 are connected in parallel with the source and drain of the PMOS transistor MP4, respectively. The source of the NMOS transistor MN4 is connected to ground GND, and the drain is connected to the source of the NMOS transistor MN3. Also, the source and drain of the NMOS transistor MN5 are connected in parallel with the source and drain of the NMOS transistor MN4, respectively. The respective gates of the PMOS transistors MP3, MP4 and the NMOS transistors MN3, MN4 are common, and connected to the input terminal IN0. On the other hand, the drains of the PMOS transistor MP3, and the NMOS transistor MN3 are connected to the input of the inverter INV3, whose output is connected to the input of the inverter INV4, the output of the inverter INV3 being also connected to the gates of the PMOS transistor MP5 and the NMOS transistor MN5. The output OUT0 from the inverter INV4 is input to the transfer gate 23k on the output side.

In a Schmitt circuit 21k with this kind of construction, when the level of the signal from the input terminal IN0 is L, the PMOS transistors MP3, MP4 go ON, and the NMOS transistors MN3, MM4 go OFF. When the level of the input to the inverter INV3 becomes H, the level of the output becomes L, and the level of the output OUT from the inverter INV4 becomes H. The PMOS transistor MP5 whose gate is connected to the inverter INV3 goes ON, and the NMOS transistor MN5 goes OFF. The input threshold level of the first stage inverter is determined by the ratio between the sum of transistor ON resistance on the PMOS side, and the sum of transistor ON resistance on the NMOS side, so in the state described above (transistor MP5 is ON, transistor MN5 is OFF), the level becomes high (t1 in FIGS. 2A and 2B). On the other hand, when the level of the signal from the input terminal IN is H, the ON/OFF states of each of the transistors is reversed, so the input threshold level becomes low (t2 in FIGS. 2A and 2B).

In other words, when the level at the input terminal IN changes from L to H, the threshold level becomes a positive trigger voltage (t1 in FIGS. 2A and 2B), and when the level changes from H to L, the threshold level becomes a negative voltage (t2 in FIGS. 2A and 2B), resulting in hysteresis characteristics.

On the other hand, what determines the rising and falling characteristics of the Schmitt circuit is mainly the ON/OFF speed of the PMOS transistor MP3 and NMOS transistor MN3. Therefore, it is possible to construct the Schmitt circuits 21a to 21n so that the sizes of each of the respective PMOS transistors MP3 and NMOS transistors are different, and so that the rising and falling characteristics of the Schmitt circuits 21a to 21n are different.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An oscillation circuit, comprising:
   an inverting amplifier that is constructed so that a solid oscillator can be connected between the input and output terminals thereof, and its gain can be adjusted externally; and
   a wave-shaping circuit that shapes the waveform of an oscillation signal that is output from the inverting amplifier to a digitized signal, wherein
   the wave-shaping circuit is constructed so that it is capable of adjusting rising and falling characteristics of the waveform to correspond with the gain adjustment by the inverting amplifier.

2. The oscillation circuit of claim 1, wherein
the inverting amplifier comprises a plurality of inverter circuits that can be selectively operated, and
one or two or more inverter circuits are selected from the group consisting of the plurality of inverter circuits to function as the inverting amplifier.

3. The oscillation circuit of claim 1, wherein
the inverting amplifier comprises a plurality of inverter circuits that can be selectively operated, and
the plurality of inverter circuits each have different gains.

4. The oscillation circuit of claim 3, wherein
the plurality of inverter circuits are constructed so that the sizes of the respective transistors that perform the inverting operation are different.

5. An oscillation circuit, comprising:
an inverting amplifier that is constructed so that a solid oscillator can be connected between the input and output terminals thereof, and its gain can be adjusted externally; and
a wave-shaping circuit that shapes the waveform of an oscillation signal that is output from the inverting amplifier to a digitized signal, wherein
the wave-shaping circuit is constructed so that it is capable of adjusting the wave-shaping characteristics to correspond with the gain adjustment by the inverting amplifier,
the wave-shaping circuit comprises a plurality of Schmitt circuits that can be selectively operated, and
the plurality of Schmitt circuits have respectively different rising and falling characteristics.

6. The oscillation circuit of claim 5, wherein
the plurality of Schmitt circuits comprise inverter-type circuits, and are constructed so that the sizes of a plurality of respective transistors that perform the inverting operation are different from one another.

7. A semiconductor device comprising the oscillator circuit of claim 1.

8. A semiconductor device comprising the oscillator circuit of claim 2.

9. A semiconductor device comprising the oscillator circuit of claim 3.

10. A semiconductor device comprising the oscillator circuit of claim 4.

11. A semiconductor device comprising the oscillator circuit of claim 5.

12. A semiconductor device comprising the oscillator circuit of claim 6.

13. The oscillation circuit of claim 1, wherein the wave-shaping circuit comprises a plurality of Schmitt circuits that can be selectively operated.

14. An oscillation circuit comprising:
an inverting amplifier;
a wave-shaping circuit that shapes the waveform of an oscillation signal that is output from the inverting amplifier; and
a selector coupled between the inverter amplifier and the wave-shaping circuit,
wherein the wave-shaping circuit comprises a plurality of Schmitt circuits that have respectively different characteristics,
wherein the selector outputs a signal from the inverter amplifier to one of the Schmitt circuits.

15. The oscillation circuit of claim 1, wherein the wave-shaping circuit comprises a plurality of Schmitt circuits having respectively different rising and falling characteristics.

16. The oscillation circuit of claim 1, wherein the wave-shaping circuit comprises a plurality of Schmitt circuits comprising a plurality of transistors.

17. The oscillation circuit of claim 14, wherein the wave-shaping circuit comprises a plurality of Schmitt circuits having respectively different rising and falling characteristics.

18. The oscillation circuit of claim 14, wherein the wave-shaping circuit comprises a plurality of Schmitt circuits comprising a plurality of transistors.

* * * * *